(12) United States Patent
Maekawa

(10) Patent No.: US 7,691,208 B2
(45) Date of Patent: Apr. 6, 2010

(54) CLEANING METHOD

(75) Inventor: Koji Maekawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 131 days.

(21) Appl. No.: 12/064,721

(22) PCT Filed: Aug. 30, 2006

(86) PCT No.: PCT/JP2006/317103

§ 371 (c)(1),
(2), (4) Date: Feb. 25, 2008

(87) PCT Pub. No.: WO2007/026762

PCT Pub. Date: Mar. 8, 2007

(65) Prior Publication Data

US 2009/0133715 A1    May 28, 2009

(30) Foreign Application Priority Data

Aug. 31, 2005    (JP)    ............... 2005-251819

(51) Int. Cl.
*C23G 1/00*    (2006.01)
(52) U.S. Cl. .................. 134/2; 134/16; 134/21; 134/22.1; 134/22.18; 134/31; 134/34; 134/35; 134/36; 134/37; 134/42

(58) Field of Classification Search ............ 134/2, 134/16, 21, 22.1, 22.18, 31, 34, 35, 36, 37, 134/42

See application file for complete search history.

(56) References Cited

U.S. PATENT DOCUMENTS

2004/0016441 A1 * 1/2004 Sekiya et al. ............. 134/1.1
2009/0133715 A1 * 5/2009 Maekawa ................ 134/2

FOREIGN PATENT DOCUMENTS

| JP | 3 295232 | 12/1991 |
| JP | 9 260303 | 10/1997 |
| JP | 10 317142 | 12/1998 |
| JP | 2002 25924 | 1/2002 |
| JP | 2004 311894 | 11/2004 |
| JP | 2004 311929 | 11/2004 |
| JP | 2005 72291 | 3/2005 |

* cited by examiner

*Primary Examiner*—Sharidan Carrillo
(74) *Attorney, Agent, or Firm*—Oblon, Spivak, McClelland, Maier & Neustadt, L.L.P.

(57) ABSTRACT

In a process chamber of a substrate processing apparatus, such as an RTP apparatus, a carrier is placed and configured to carry out a contaminant that has been attached to it. In this state, a cleaning gas containing $N_2$ and $O_2$ is introduced into the process chamber, and cleaning is performed under conditions including a pressure of 133.3 Pa or less and a temperature of 700° C. to 1,100° C. This cleaning is repeatedly performed by sequentially replacing a plurality of carriers.

16 Claims, 4 Drawing Sheets

CLEANING METHOD

TECHNICAL FIELD

The present invention relates to a cleaning method and, more particularly, to a cleaning method for removing a contaminant from the process chamber of a substrate processing apparatus which processes a target substrate such as a semiconductor wafer by, e.g., annealing.

BACKGROUND ART

RTP (Rapid Thermal Processing) is known as one semiconductor device manufacturing process. For example, after implanting ions into a semiconductor wafer (which may be merely referred to as a "wafer" hereinafter), annealing is performed for rearranging impurities or recovering crystal damage. When a thermal budget (amount of heat during process) in the annealing step increases, dopants (impurities) tend to diffuse in the source/drain regions, in the case of, e.g., a transistor. This deepens the junction and decreases the dopant concentration. A shallow junction is indispensable under a micro-design rule. Hence, RTP is employed which can decrease the total thermal budget by increasing and decreasing the temperature rapidly within a short period of time.

In such RTP, the wafer temperature must be increased and decreased rapidly with a good controllability in a clean atmosphere where no foreign substance or contaminant is present in a container. For this purpose, after an RTP apparatus is delivered or repaired, it is indispensable to calibrate the temperature of the apparatus by increasing and decreasing the temperature while a TC wafer (Si substrate with a thermocoulpe) having a temperature measurement function is set in the process chamber thereof. Use of the TC wafer for temperature calibration may, however, contaminate the interior of the process chamber with Cu. When the interior of the process chamber is contaminated with Cu, Cu may be attached to a target wafer during later annealing and may infiltrate into a device as a contaminant, greatly impairing the reliability of semiconductor devices.

As a prior art for removing metal contamination in a thermal processing apparatus, it is proposed in a thermal diffusion furnace to supply a purge gas such as ammonia into a reaction chamber and activate the gas to react with a metal contaminant contained in a member inside the reaction chamber, thereby removing the metal contaminant (for example, Jpn. Pat. Appln. KOKAI Publication No. 2004-311929; claim 2, FIG. 6 and so forth).

More specifically, the method of Jpn. Pat. Appln. KOKAI Publication No. 2004-311929 activates ammonia gas at a temperature of 950° C. and a pressure of 15,960 Pa. Under these conditions, ammonia gas provides a larger cleaning effect than $N_2$ gas. However, the method of Jpn. Pat. Appln. KOKAI Publication No. 2004-311929 also has the function of nitriding the surface of a quartz member in the reaction chamber so that impurities such as a metal are confined in the quartz member, thereby preventing the impurities such as a metal from diffusing in the reaction chamber. This method is thus not aimed at reducing the impurities such as a metal in the reaction chamber to a level that does not cause a problem. Hence, according to the above method, every time the interior of the reaction chamber is cleaned with a fluorine-containing cleaning gas, a purge process must be performed with ammonia gas.

DISCLOSURE OF INVENTION

It is an object of the present invention to provide a cleaning method that can efficiently remove a contaminant such as Cu which contaminates the interior of a process chamber.

In view of the above situations, the present inventor conducted extensive studies and reached findings that in a process such as a thermal process, Cu contamination of a wafer tends to increase when the pressure inside a process chamber is low as compared to a case in which the pressure is high. This may be caused by the phenomenon that Cu attached to or mixed in the wall or an instrument in the process chamber diffuses in the process chamber during a low-pressure thermal process and is attached to the wafer. Hence, to decrease Cu existing in the process chamber, it may be better to decrease the pressure even during cleaning.

It has also been found that, to discharge Cu efficiently, it is effective to cause metal Cu to change to a substance with a higher vapor pressure, e.g., a metal oxynitride. This was followed by achievement of the present invention.

It has further been found that the cleaning efficiency is higher where an appropriate carrier is placed in the process chamber and unloaded after Cu is positively attached to the carrier, as compared to a case where purging is performed merely with ammonia gas, as in the method described in Jpn. Pat. Appln. KOKAI Publication No. 2004-311929.

According to a first aspect of the present invention, there is provided a cleaning method for removing a contaminant including a metal existing in a process chamber of a substrate processing apparatus, the cleaning method comprising:

introducing a cleaning gas containing $N_2$ and $O_2$ into the process chamber, performing cleaning under conditions including a pressure of not more than 133.3 Pa and a temperature of 700° C. to 1,100° C., and discharging the contaminant in the form of a metal oxynitride from the process chamber.

In the first aspect, $N_2$ and $O_2$ in the cleaning gas are preferably supplied at a flow rate ratio of 1:1. The metal oxynitride preferably comprises $CuNO_x$ (where x represents a stoichiometrically possible value). The temperature is preferably 1,000° C. to 1,100° C.

According to a second aspect of the present invention, there is provided a cleaning method for removing a contaminant existing in a process chamber of a substrate processing apparatus, the cleaning method comprising:

introducing a cleaning gas into the process chamber, and performing cleaning under conditions including a pressure of not more than 666.6 Pa and a temperature of 700° C. to 1,100° C., while placing in the process chamber a carrier which is configured to carry out the contaminant that has been attached thereto.

The temperature is preferably 1.3 Pa to 133.3 Pa. The cleaning gas preferably comprises a gas containing $N_2$ and $O_2$. In this case $N_2$ and $O_2$ are preferably supplied at a flow rate ratio of 1:1.

The contaminant preferably comprises a metal or a compound thereof. The method preferably comprises repeating cleaning while sequentially replacing a plurality of carriers corresponding to said carrier. In this case, the carriers preferably comprise a material containing silicon.

The substrate processing apparatus preferably comprises an RTP apparatus. The process chamber may incorporate a quartz member.

According to a third aspect of the present invention, there is provided a cleaning method comprising:

loading into a process chamber of a substrate processing apparatus a carrier which is configured to carry out a contaminant that has been attached thereto;

increasing internal temperature of the process chamber;

reducing internal pressure of the process chamber and exhausting gas therefrom;

introducing a cleaning gas into the process chamber and performing a process under conditions including a pressure of not more than 666.6 Pa and a temperature of 700° C. to 1,100° C.;

decreasing internal temperature of the process chamber;

stopping the cleaning gas and increasing internal pressure of the process chamber; and unloading the carrier, to which the contaminant is attached, from the process chamber.

In this case, the temperature is preferably 1,000° C. to 1,100° C.

According to a fourth aspect of the present invention, there is provided a control program for execution on a computer, wherein the control program, when executed, controls a substrate processing apparatus to perform a cleaning method for removing a contaminant existing in a process chamber of the substrate processing apparatus, by introducing a cleaning gas into the process chamber, and performing cleaning under conditions including a pressure of not more than 666.6 Pa and a temperature of 700° C. to 1,100° C., while placing in the process chamber a carrier which is configured to carry out the contaminant that has been attached thereto.

According to a fifth aspect of the present invention, there is provided a computer readable storage medium that stores a control program for execution on a computer, wherein the control program, when executed, controls a substrate processing apparatus to perform a cleaning method for removing a contaminant existing in a process chamber of the substrate processing apparatus, by introducing a cleaning gas into the process chamber, and performing cleaning under conditions including a pressure of not more than 666.6 Pa and a temperature of 700° C. to 1,100° C., while placing in the process chamber a carrier which is configured to carry out the contaminant that has been attached thereto.

According to a sixth aspect of the present invention, there is provided a substrate processing apparatus comprising:

a process chamber configured to accommodate a target substrate;

a heating device for heating the target substrate in the process chamber;

a pressure-reducing device for reducing a pressure inside the process chamber; and a controller configured to control the apparatus to perform a cleaning method for removing a contaminant existing in the process chamber, by introducing a cleaning gas into the process chamber, and performing cleaning under conditions including a pressure of not more than 666.6 Pa and a temperature of 700° C. to 1,100° C., while placing in the process chamber a carrier which is configured to carry out the contaminant that has been attached thereto.

According to the present invention, since the interior of a process chamber in a substrate processing apparatus can be cleaned efficiently, metal contamination of a target substrate is suppressed. This can improve the yield of semiconductor devices manufactured by this method and the reliability of the devices.

BEST MODE FOR CARRYING OUT THE INVENTION

A preferred embodiment of the present invention will be described hereinafter with reference to the accompanying drawing.

Figure 1:
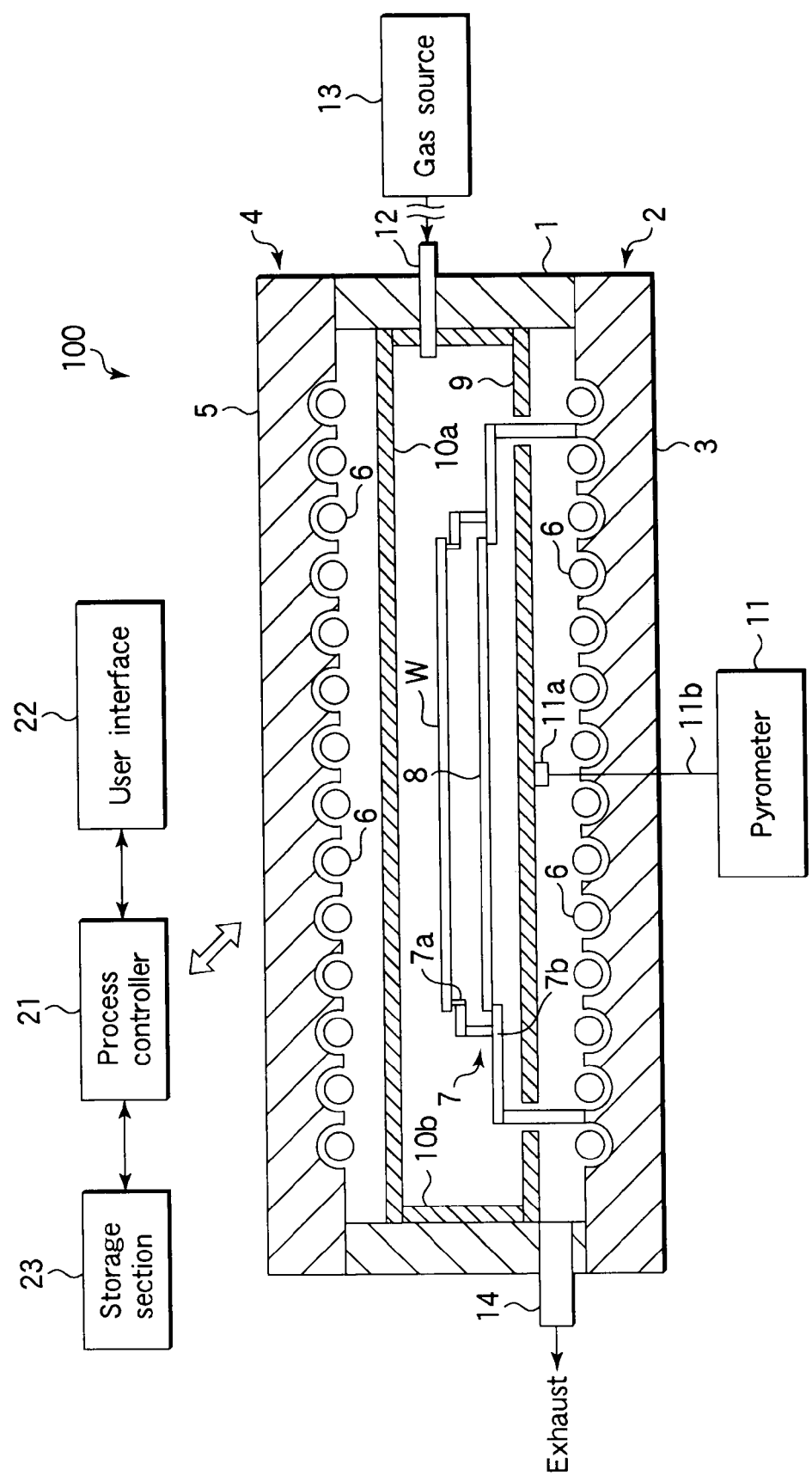
FIG. 1 is a sectional view schematically showing the structure of a thermal processing apparatus.

FIG. 1 is a schematic view schematically showing the structure of a thermal processing apparatus to which a cleaning method according to the present invention can be applied. This thermal processing apparatus 100 is constituted as a single wafer type RTP apparatus for performing well-controllable rapid annealing (RTA; Rapid Thermal Annealing). The thermal processing apparatus 100 can be employed in, e.g., high-temperature annealing in the range of about 800° C. to 1,100° C. which takes place after a thin film formed on a wafer W is doped with impurities.

Referring to FIG. 1, reference numeral 1 denotes a cylindrical chamber. A lower heat generating unit 2 is detachably arranged on the lower side of the chamber 1. An upper heat generating unit 4 is detachably arranged on the upper side of the chamber 1 to oppose the lower heat generating unit 2. The lower heat generating unit 2 has a water-cooling jacket 3 and a plurality of tungsten lamps 6 serving as a heating device arranged on the upper surface of the water-cooling jacket 3. Similarly, the upper heat generating unit 4 has a water-cooling jacket 5 and a plurality of tungsten lamps 6 serving as a heating device arranged on the lower surface of the water-cooling jacket 5. The lamps are not limited to tungsten lamps but may be, e.g., xenon lamps. The tungsten lamps 6 provided in the chamber 1 to oppose each other in this manner are connected to a heater power supply (not shown). The heat generation amount of the tungsten lamps 6 can be controlled by adjusting a power supply amount from the heater power supply.

A support mechanism 7 for supporting the wafer W is arranged between the lower heat generating unit 2 and upper heat generating unit 4. The support mechanism 7 includes wafer support pins 7a for supporting and holding the wafer W in a process space inside the chamber 1, and a liner setting portion 7b which supports a hot liner 8 for measuring the temperature of the wafer W during the process. The support mechanism 7 is connected to a rotary mechanism (not shown) which rotates the support mechanism 7 about a vertical axis as a whole. Thus, the wafer W rotates at a predetermined speed during the process, thereby improving the uniformity of the thermal process.

A pyrometer 11 is arranged under the chamber 1. During the thermal process, the pyrometer 11 measures heat rays from the hot liner 8 through a port 11a and an optical fiber 11b, so that the temperature of the wafer W can be grasped indirectly. Alternatively, the temperature of the wafer W may be measured directly.

Under the hot liner 8, a quartz member 9 is arranged between the hot liner 8 and the tungsten lamps 6 of the lower heat generating unit 2. As shown in FIG. 1, the port 11a is provided to the quartz member 9. The port 11a may comprise a plurality of ports.

Above the wafer W, a quartz member 10a is arranged between the wafer W and the tungsten lamps 6 of the upper heat generating unit 4. A quartz member 10b is disposed on the inner surface of the chamber 1 to surround the wafer W.

Lifter pins (not shown) for supporting and vertically moving the wafer W are arranged to extend through the hot liner 8. The lifter pins are used when loading/unloading the wafer W.

Seal members (not shown) are disposed between the lower heat generating unit 2 and chamber 1 and between the upper heat generating unit 4 and chamber 1, respectively. The seal members render the interior of the chamber 1 airtight.

A gas source 13 connected to a gas introduction pipe 12 is provided on a side of the chamber 1. A cleaning gas such as $N_2$ gas or $O_2$ gas, an inert gas such as argon gas, and so forth can be introduced into the process space in the chamber 1 through the gas introduction pipe 12. An exhaust pipe 14 is connected to a lower portion of the chamber 1. An exhaust unit (not shown) can reduce the pressure inside the chamber through the exhaust pipe 14.

The respective components of the thermal processing apparatus 100 are connected to a process controller 21 comprising a CPU and controlled by the process controller 21. The process controller 21 is connected to a user interface 22 comprising a keyboard through which an operator inputs commands to manage the thermal processing apparatus 100, a display which visually displays the operation status of the thermal processing apparatus 100, and so forth.

The process controller 21 is also connected to a storage section 23 which stores recipes such as a control program (software) for implementing various types of processes to be executed by the thermal processing apparatus 100 under the control of the process controller 21, process condition data, and so forth.

As needed, a required recipe is called from the storage section 23 upon instruction or the like from the user interface 22 and executed by the process controller 21, so a desired process is performed in the thermal processing apparatus 100 under the control of the process controller 21. For example, the heating rate and heating temperature of the wafer W can be controlled by the process controller 21 by controlling power supply amounts to the respective tungsten lamps 6 provided to the lower heat generating unit 2 and upper heat generating unit 4. Also, the pressure inside the chamber 1 can be adjusted by the process controller 21 by, e.g., controlling driving of the exhaust unit (not shown) and a gas introduction amount from the gas source 13.

Recipes with control programs and process condition data recorded therein may be stored in a computer readable storage medium, such as a CD-ROM, hard disk, flexible disk, or flash memory. Further, recipes may be utilized on-line, while it is transmitted from another apparatus through, e.g., a dedicated line, as needed.

In the thermal processing apparatus 100 having the above arrangement, a wafer W is processed in the following manner. First, the wafer W is loaded into the chamber 1 through a wafer transfer port (not shown) and set on the support mechanism 7. Then, an airtight space is formed in the chamber 1. Under the control of the process controller 21, a predetermined power is supplied from the heater power supply (not shown) to the respective tungsten lamps 6 of the lower heat generating unit 2 and upper heat generating unit 4 to turn on the tungsten lamps 6. Then, the respective tungsten lamps 6 generate heat. The generated heat reaches the wafer W through the quartz members 9 and 10a so the wafer W is rapidly heated from above and below under conditions (temperature increase rate, heating temperature, and so forth) in accordance with a recipe. The exhaust unit (not shown) is actuated while heating the wafer W to exhaust gas through the exhaust pipe 14, thereby reducing the pressure inside the chamber 1.

During the thermal process, the rotary mechanism (not shown) rotates the support mechanism 7 in, e.g., the horizontal direction about a vertical axis as a whole to rotate the wafer W. As a result, the uniformity of the amount of heat supplied to the wafer W is ensured.

During the thermal process, the pyrometer 11 measures the temperature of the hot liner 8 to control the temperature of the wafer W indirectly. The temperature data measured by the pyrometer 11 is fed back to the process controller 21. If the measured temperature is different from the preset temperature of the recipe, power supply to the tungsten lamps 6 is adjusted.

When the thermal process is ended, the tungsten lamps 6 of the lower heat generating unit 2 and upper heat generating unit 4 are turned off, and the pressure inside the chamber 1 is increased. Further, gas is exhausted from inside the chamber 1 through the exhaust pipe 14 while supplying a purge gas such as nitrogen into the chamber 1 through a purge port (not shown), thereby cooling the wafer W. After that, the wafer W is unloaded from the chamber 1 through the wafer transfer port (not shown).

Figure 2:
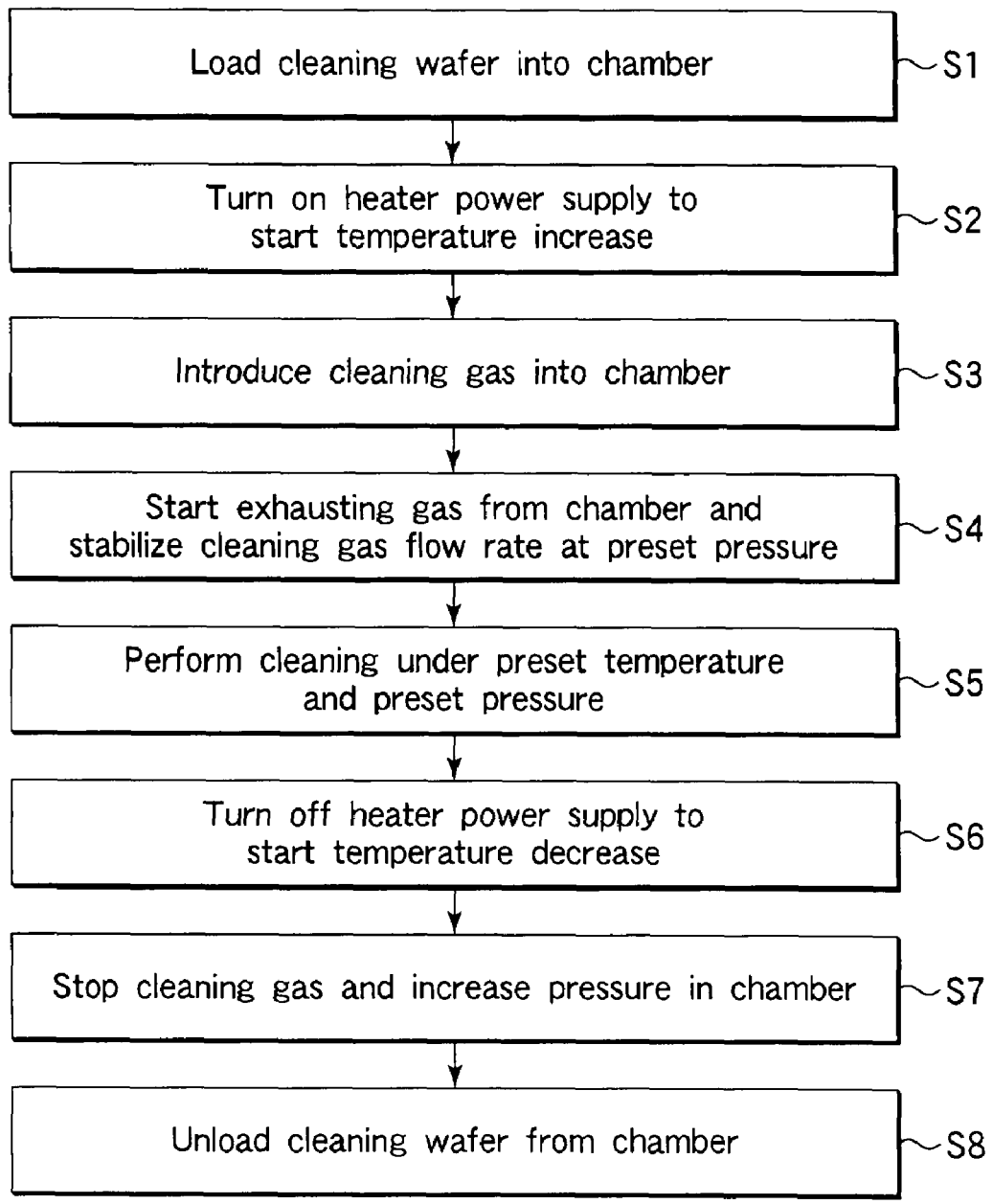
FIG. 2 is a flowchart for explaining an example of a cleaning sequence.

Cleaning in the thermal processing apparatus 100 will be described with reference to FIGS. 2 and 3. Cleaning is done under a predetermined pressure by using a cleaning wafer CW as a carrier which carries a contaminant such as Cu outside the chamber 1. The material and so forth of the cleaning wafer CW can be selected in accordance with the type of the contaminant. For example, if the contaminant to be removed is Cu, the cleaning wafer CW may be formed of a member made of a silicon-containing material such as an Si substrate, or a substrate containing poly-silicon, silicon nitride, silicon oxide, or the like as a constituent element. The cleaning wafer CW may be made of a different material in accordance with the type of a contaminant.

First, in step S1, the cleaning wafer CW is loaded into the chamber 1 and set on the support mechanism 7. After that, an airtight space is formed in the chamber 1. In step S2, under the control of the process controller 21, the heater power supply (not shown) is turned on to supply a predetermined power to the respective tungsten lamps 6 of the lower heat generating unit 2 and upper heat generating unit 4, thereby turning on the tungsten lamps 6. Heat rays (with a wavelength of 800 nm to 3,000 nm in the near-infrared range) thus generated heat the hot liner 8 in the chamber 1 to heat the wafer W to a predetermined temperature.

Subsequently, a cleaning gas is introduced from the gas source 13 into the chamber 1 while heating the cleaning wafer CW (step S3). Although the type of cleaning gas is not particularly limited, $N_2$ and $O_2$ are preferably used. This is so because if heating is done with only $N_2$ gas, the quartz member in the chamber 1 may be damaged and generate particles.

$N_2$ and $O_2$ react at a high temperature of, e.g., 900° C. and more particularly 1,000° C. or more and form NO. If NO reacts with, e.g., Cu as the contaminant, it forms a metal oxynitride such as $CuNO_x$ (where x represents a stoichiometrically possible value). The metal oxynitride has a higher vapor pressure than the metal alone and, in the vacuum, can be emitted easily into the atmosphere. Thus, Cu as the contaminant in the chamber 1 can be emitted in the form of a metal oxynitride into the atmosphere and discharged outside the chamber 1 efficiently together with the exhaust gas. In this case, for example, the flow rate ratio of $N_2$ to $O_2$ can be set to $N_2:O_2=1:0.1$ to 3, and is preferably 1:1 for the sake of forming NO efficiently.

Subsequently, in step S4, the exhaust unit (not shown) is actuated to exhaust gas through the exhaust pipe 14. This sets the interior of the chamber 1 to a predetermined low-pressure state and stabilizes the flow rate of the cleaning gas.

In step S5, cleaning is performed for a predetermined period of time at a preset temperature and a preset pressure. Step S5 is done under a cleaning pressure of 666.6 Pa or less. If the cleaning pressure exceeds 666.6 Pa, a sufficient cleaning effect cannot be obtained. From the viewpoint of improving the cleaning effect, the cleaning pressure is preferably set to, e.g., 1.3 Pa to 133.3 Pa, and more preferably 6.7 Pa to 106.7 Pa. The reason for this is as follows. For example, Cu has a very low vapor pressure of as low as 133.3 Pa/1,628° C., whereas the metal oxynitride, which is formed when Cu and NO react in the chamber, has a higher vapor pressure than Cu alone, and thus can be discharged easily into the vacuum. Hence, cleaning under low-pressure conditions is effective.

The cleaning temperature is preferably, e.g., 700° C. to 1,100° C., more preferably 900° C. to 1,100° C., and most preferably 1,000° C. to 1,100° C.

During the cleaning, the rotary mechanism (not shown) rotates the support mechanism 7 about the vertical axis (i.e., in the horizontal direction) as a whole at a rotational speed of, e.g., 20 rpm, thereby rotating the cleaning wafer CW. As a result, the amount of heat supplied to the cleaning wafer CW is uniformized.

During the cleaning, the pyrometer 11 measures the temperature of the cleaning wafer CW indirectly through the hot liner 8. The temperature data measured by the pyrometer 11 is fed back to the process controller 21. If the measured temperature is different from the preset cleaning temperature of the recipe, power supply to the tungsten lamps 6 is adjusted.

After the cleaning is ended, the heater power supply (not shown) is turned off to turn off the tungsten lamps 6 of the lower heat generating unit 2 and upper heat generating unit 4, thereby decreasing the temperature (step S6). In step S7, the cleaning gas is stopped and the pressure inside the chamber 1 is increased. In step S8, the cleaning wafer CW is unloaded from the chamber 1. Cleaning using one cleaning wafer CW is ended through the process of the above steps S1 to S8.

Figure 3:
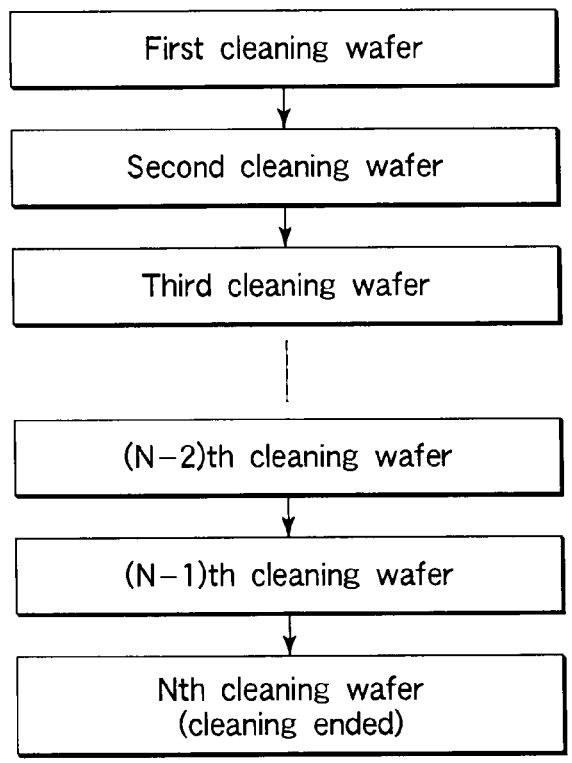
FIG. 3 is a flowchart for explaining cleaning.

As shown in FIG. 3, using, e.g., first to nth cleaning wafers CW, steps S1 to S8 are repeatedly performed, thus ending the cleaning of the chamber 1. Regarding the cleaning end point, the Cu contamination amounts on the respective cleaning wafers CW employed are measured by a device such as an ICP-MS (inductively coupled plasma ion mass spectrometer). A time point when the Cu contamination amounts decrease to a predetermined value or less can be determined as the cleaning end point. Usually, about 25 to 50 cleaning wafers CW are used depending on the degree of contamination and the required value, and steps S1 to S8 are repeated to decrease the contaminant such as Cu to a level that poses no problem, so that the interior of the chamber 1 can be cleaned. The type of cleaning wafer CW to be used can be changed for each cleaning cycle consisting of steps S1 to S8, so a plurality of contaminants can be removed.

In this manner, according to the present invention, the interior of the chamber 1 is purged with the cleaning gas, and simultaneously the plurality of cleaning wafers CW are used as carriers for contaminants. As a result, the amount of Cu removed from the chamber 1 is the sum amount of Cu discharged to the outside of the chamber 1 by exhaust and Cu carried out to the outside of the chamber using the cleaning wafers CW as the carriers. Accordingly, as compared to a case in which cleaning is performed by only exhaust merely using a cleaning gas, the Cu removing efficiency, i.e., the cleaning efficiency, can be increased.

Results of experiments that form the base of the present invention will be described with reference to FIGS. 4 and 5.

Figure 4:
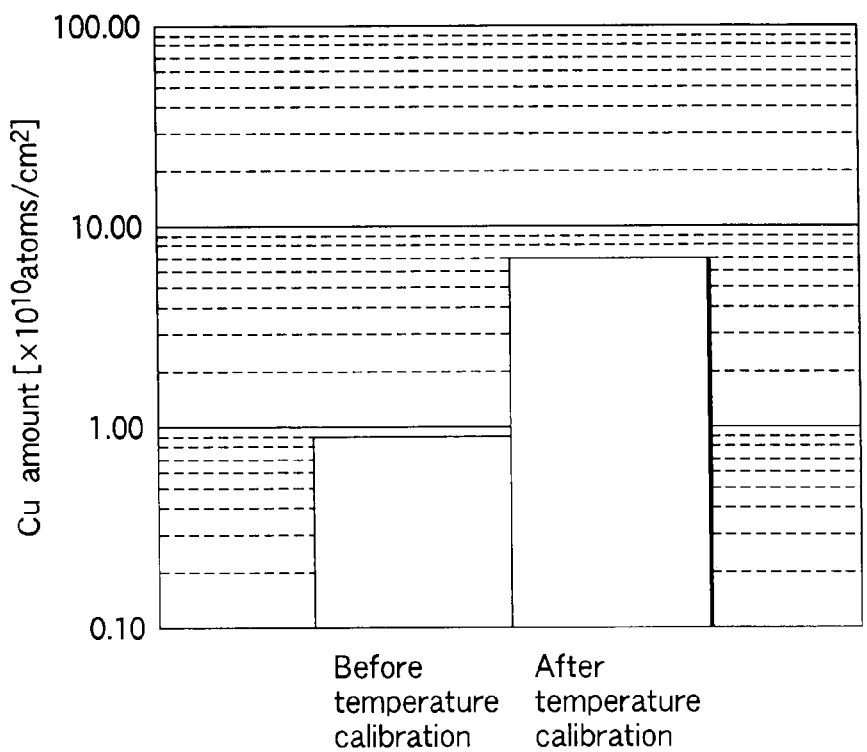
FIG. 4 is a graph showing the measurement result of Cu contamination amount before and after temperature calibration.

FIG. 4 shows results obtained where wafers W were thermally processed and the Cu amount per unit area of the surface of each wafer W was measured by ICP-MS, before and after temperature calibration was performed in the thermal processing apparatus 100 by using a TC wafer having a temperature measurement function. As shown in FIG. 4, the Cu amount on the surface of the wafer W processed before the temperature calibration was $0.9 \times 10^{10}$ [atoms/cm$^2$], whereas the Cu amount on the surface of the wafer W processed after the temperature calibration was $7.0 \times 10^{10}$ [atoms/cm$^2$], showing a great increase in Cu amount.

Figure 5:
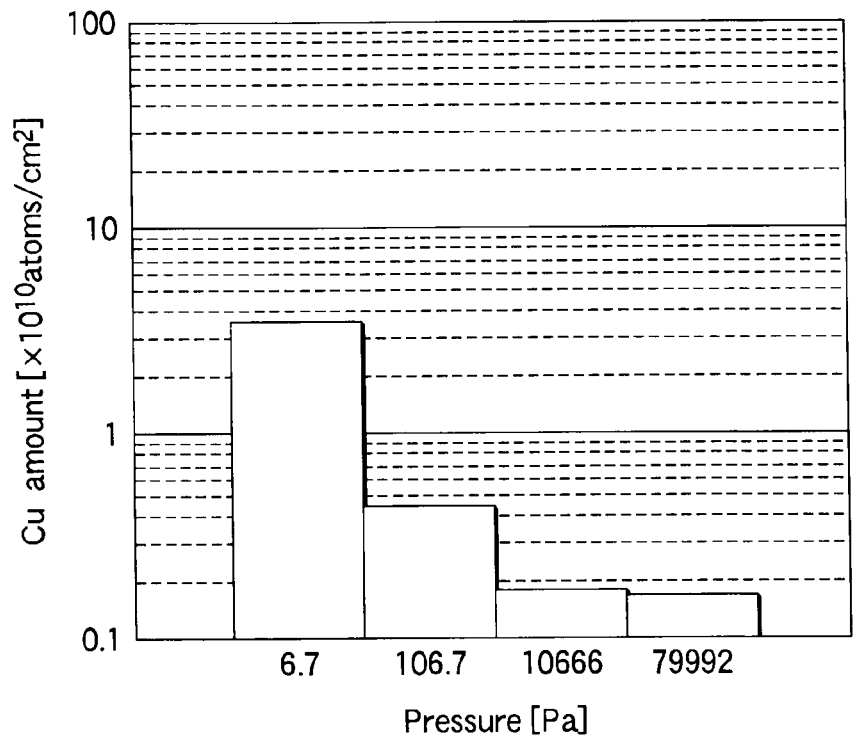
FIG. 5 is a graph showing the relationship between the pressure and Cu contamination amount.

FIG. 5 shows results obtained where wafers W were thermally processed while changing the pressure and the Cu amount per unit area of the surface of each wafer W was measured by ICP-MS, after temperature calibration was performed in the thermal processing apparatus 100 by using the TC wafer having a temperature measurement function. Four different pressures, i.e., 6.7 Pa (50 mTorr), 106.7 Pa (800 mTorr), 10,666 Pa (80 Torr), and 79,992 Pa (600 Torr), were employed in this thermal process. $O_2$ gas was introduced into the chamber 1 with a flow rate of 2 L/min (slm), and the process was performed at 1,100° C. (where the processing pressure was 6.7 Pa, the $O_2$ gas was introduced with a flow rate of 20 mL/min (sccm)).

As shown in FIG. 5, as the pressure of the thermal process changed from the high-pressure side (79,992 Pa) to the low-pressure side (6.7 Pa), the Cu contamination amount increased. In particular, when the processing pressure was 6.7 Pa, a typical increase was observed in the Cu contamination amount. This led to a supposition that in the chamber 1 contaminated with Cu by temperature calibration, if low-pressure conditions were employed for cleaning as well, a contaminant such as Cu attached to or mixed in the inner wall of the chamber 1 or the members in the chamber 1 could be efficiently emitted into the process space.

A certain amount of emitted Cu was attached to the wafer W. This led to a possibility that, where cleaning is performed by placing a contaminant carrier member, e.g., a cleaning wafer CW, the contaminant is carried out outside the chamber by the carrier, thereby performing efficient cleaning.

The result of a test that confirmed the effect of the present invention will be described.

Figure 6:
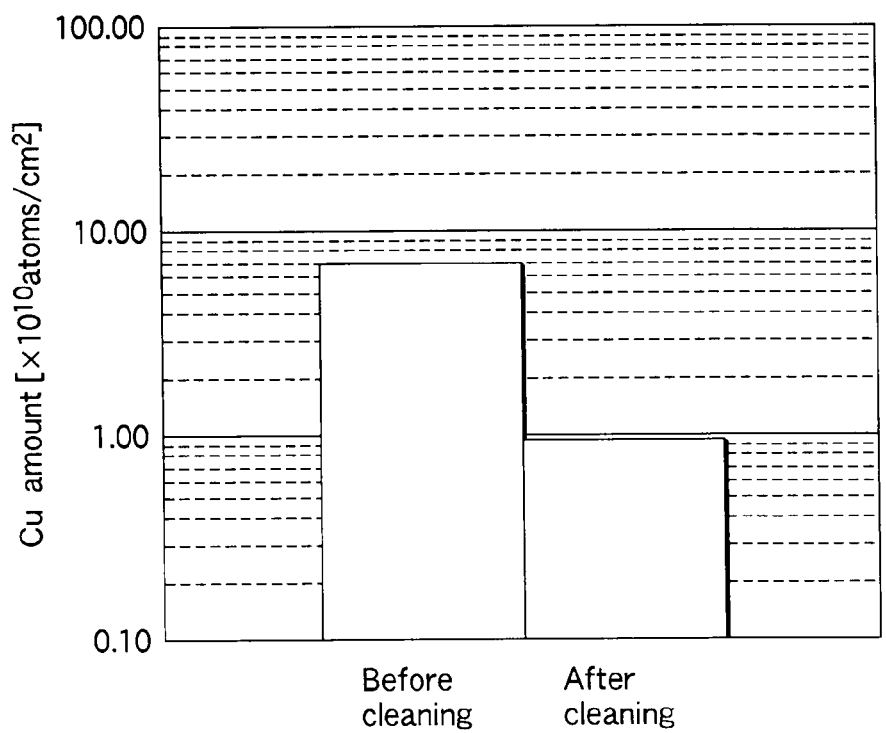
FIG. 6 is a graph showing the Cu contamination amount before and after cleaning.

In a thermal processing apparatus 100 identical to that in FIG. 1, temperature calibration was performed using a TC wafer having a temperature measurement function. After that, cleaning was performed. Thermal processing was performed before and after the cleaning. The Cu contamination amount of a wafer W after the process was measured by the ICP-MS. FIG. 6 shows the result. The cleaning conditions and thermal processing conditions are as follows.

<Cleaning Conditions>

Process gas: $N_2$ and $O_2$ were used with a flow rate ratio of $N_2:O_2=1,000:1,000$ mL/min (sccm)

Processing pressure: 133.3 Pa (1 Torr)

Processing temperature (maximum temperature): 1,100° C.

Process time: 50 sec per cleaning wafer Number of times of cleaning operations: 25

<Thermal Processing Conditions>

Process gas: $N_2$ and $O_2$ were used with a flow rate ratio of 1:1

Processing pressure: 133.3 Pa (1 Torr)

Processing temperature (maximum temperature): 1,100° C.

Duration of maximum temperature: 50 sec

As shown in FIG. 6, the Cu amount on the surface of the wafer W processed before the cleaning (immediately after temperature calibration) was $7.0 \times 10^{10}$ [atoms/cm²], whereas that of the wafer W processed after the cleaning decreased to $0.9 \times 10^{10}$ [atoms/cm²]. The Cu contamination amount could thus be decreased to the level equivalent to that before temperature calibration (see FIG. 4).

The above result shows that by practicing a cleaning method according to the present invention, metal contamination of the wafer W can be suppressed, and the yield of semiconductor devices to be manufactured utilizing this cleaning method and the reliability of the devices can be improved.

Although the embodiment of the present invention has been described, the present invention is not limited to the above embodiment and various modifications can be made. For example, although the RTP thermal processing apparatus 100 was described as an example in FIG. 1, a cleaning method according to the present invention can be applied to a substrate processing apparatus which forms a film on a substrate or a processing apparatus which forms a CVD film by use plasma.

The technical idea of the present invention can also be applied to a case in which the target substrate is a glass substrate for a flat panel display (FPD) represented by a liquid crystal display (LED) and a case in which the target substrate is a compound semiconductor substrate.

INDUSTRIAL APPLICABILITY

The present invention can be suitably used for cleaning of the interior of the process chamber of a substrate processing apparatus which is used in the manufacturing process of various types of semiconductor devices.

The invention claimed is:

1. A cleaning method for removing a metal existing as a contaminant in a process chamber, which has an inner surface defined by a quartz member and is set up in a substrate processing apparatus, the cleaning method comprising:
   introducing a cleaning gas containing $N_2$ and $O_2$ at a flow rate ratio ($N_2:O_2$) of 1:0.1 to 3 into the process chamber, and performing cleaning under conditions including a pressure of 1.3 Pa to 133.3 Pa and a temperature of 900° C. to 1,100° C., thereby changing the metal to a secondary substance with a higher vapor pressure; and
   exhausting gas from inside the process chamber, thereby discharging the secondary substance from the process chamber.

2. The cleaning method according to claim 1, wherein the flow rate ratio ($N_2:O_2$) in the cleaning gas is set at essentially 1:1.

3. The cleaning method according to claim 1, wherein the secondary substance comprises CuNOx, in which x represents a stoichiometrically possible value.

4. The cleaning method according to claim 1, wherein the temperature is 1,000° C. to 1,100° C.

5. The cleaning method according to claim 1, wherein the metal is Cu.

6. A cleaning method for removing a metal existing as a contaminant in a process chamber, which has an inner surface defined by a quartz member and is set up in a substrate processing apparatus, the cleaning method comprising:
   introducing a cleaning gas containing $N_2$ and $O_2$ at a flow rate ratio ($N_2:O_2$) of 1:0.1 to 3 into the process chamber, and performing cleaning under conditions including a pressure of 1.3 Pa to 666.6 Pa and a temperature of 900° C. to 1,100° C., while placing a contaminant removal carrier in the process chamber, thereby changing the metal to a secondary substance with a higher vapor pressure and allowing the secondary substance to be deposited on the contaminant removal carrier; and
   then, unloading the contaminant removal carrier with part of the secondary substance deposited thereon from the process chamber.

7. The cleaning method according to claim 6, wherein the temperature is 1.3 Pa to 133.3 Pa.

8. The cleaning method according to claim 6, wherein the flow rate ratio ($N_2:O_2$) in the cleaning gas is set at essentially 1:1.

9. The cleaning method according to claim 6, wherein the method further comprises repeating cleaning under the conditions in the process chamber while sequentially replacing the contaminant removal carrier.

10. The cleaning method according to claim 6, wherein the contaminant removal carrier comprises a material containing silicon.

11. The cleaning method according to claim 6, wherein the substrate processing apparatus comprises a rapid thermal processing apparatus apparatus configured to process target substrates.

12. The cleaning method according to claim 6, wherein the metal is Cu.

13. The cleaning method according to claim 6, wherein the method further comprises rotating the contaminant removal carrier during the cleaning.

14. A cleaning method for removing a metal existing as a contaminant in a process chamber, which has an inner surface defined by a quartz member and is set up in a substrate processing apparatus, the cleaning method comprising:
   loading a contaminant removal carrier into the process chamber;
   then, increasing an internal temperature of the process chamber;
   then, reducing an internal pressure of the process chamber and exhausting gas therefrom;
   then, introducing a cleaning gas into the process chamber and performing a process under conditions including a pressure of 1.3 Pa to 666.6 Pa and a temperature of 900° C. to 1,100° C., thereby changing the metal to a secondary substance with a higher vapor pressure;
   then, decreasing the internal temperature of the process chamber;
   then, stopping the cleaning gas and increasing the internal pressure of the process chamber; and
   then, unloading the contaminant removal carrier with part of the secondary substance deposited thereon from the process chamber.

15. The cleaning method according to claim 14, wherein the temperature is 1,000° C. to 1,100° C.

16. A computer readable storage medium that stores a control program for execution on a computer, wherein the control program, when executed, controls a substrate processing apparatus to perform a cleaning method for removing a metal existing as a contaminant in a process chamber, which has an inner surface defined by a quartz member and is set up in the substrate processing apparatus, the cleaning method comprising:

introducing a cleaning gas containing $N_2$ and $O_2$ at a flow rate ratio ($N_2$:$O_2$) of 1:0.1 to 3 into the process chamber, and performing cleaning under conditions including a pressure of 1.3 Pa to 666.6 Pa and a temperature of 900° C. to 1,100° C., while placing a contaminant removal carrier in the process chamber, thereby changing the metal to a secondary substance with a higher vapor pressure and allowing the secondary substance to be deposited on the contaminant removal carrier; and then, unloading the contaminant removal carrier with part of the secondary substance deposited thereon from the process chamber.

* * * * *